(12) United States Patent
Park et al.

(10) Patent No.: US 10,980,124 B2
(45) Date of Patent: *Apr. 13, 2021

(54) MULTILAYER ELECTRONIC COMPONENT AND BOARD HAVING THE SAME

(71) Applicant: SAMSUNG ELECTRO-MECHANICS CO., LTD., Suwon-si (KR)

(72) Inventors: Heung Kil Park, Suwon-si (KR); Gu Won Ji, Suwon-si (KR); Se Hun Park, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/507,962

(22) Filed: Jul. 10, 2019

(65) Prior Publication Data

US 2019/0335588 A1 Oct. 31, 2019

Related U.S. Application Data

(63) Continuation of application No. 15/987,360, filed on May 23, 2018, now Pat. No. 10,398,030.

(30) Foreign Application Priority Data

Oct. 24, 2017 (KR) .......................... 10-2017-0138681

(51) Int. Cl.
*H05K 1/18* (2006.01)
*H05K 1/11* (2006.01)
(Continued)

(52) U.S. Cl.
CPC .............. *H05K 1/181* (2013.01); *H01G 2/06* (2013.01); *H01G 4/224* (2013.01); *H01G 4/232* (2013.01);
(Continued)

(58) Field of Classification Search
CPC ................... H05K 1/181; H05K 3/301; H05K 2201/2045; H05K 2201/10628;
(Continued)

(56) References Cited

U.S. PATENT DOCUMENTS 4,991,059 A * 2/1991 Kiyose ................. H05K 3/3426
338/329
6,191,933 B1 * 2/2001 Ishigaki ................. H01G 4/232
361/309
(Continued)

FOREIGN PATENT DOCUMENTS

CN 104752055 A 7/2015
CN 109216026 A 1/2019
(Continued)

OTHER PUBLICATIONS

The First Office Action dated Aug. 26, 2020 in Chinese Patent Application No. 201810884794.0 (English translation).

*Primary Examiner* — Ishwarbhai B Patel
(74) *Attorney, Agent, or Firm* — Morgan, Lewis & Bockius LLP (57) ABSTRACT

A multilayer electronic component includes a multilayer capacitor including a capacitor body in which internal electrodes are stacked to be parallel with respect to a mounting surface and external electrodes disposed on opposing end surfaces of the capacitor body, respectively, and a metal frame having a solder pocket and including a vertical portion, an upper horizontal portion extending from an upper end of the vertical portion, and a lower horizontal portion extending from a lower end of the vertical portion, the upper horizontal portion connected to an upper band portion of each of the external electrodes. 0.1≤G/CT≤0.7 is satisfied, in which CT is a height of the vertical portion and (Continued)

G is a distance between the lower band portion of each of the external electrodes and a lower end of the metal frame.

13 Claims, 8 Drawing Sheets

(51) Int. Cl.
| | |
|---|---|
| *H01G 4/30* | (2006.01) |
| *H01G 4/232* | (2006.01) |
| *H01G 4/248* | (2006.01) |
| *H01G 4/224* | (2006.01) |
| *H05K 1/02* | (2006.01) |
| *H05K 3/30* | (2006.01) |
| *H01G 2/06* | (2006.01) |
| *H01G 4/008* | (2006.01) |
| *H01G 4/12* | (2006.01) |

(52) U.S. Cl.
CPC ........... *H01G 4/2325* (2013.01); *H01G 4/248* (2013.01); *H01G 4/30* (2013.01); *H05K 1/0271* (2013.01); *H05K 3/301* (2013.01); *H01G 4/008* (2013.01); *H01G 4/12* (2013.01); *H01G 4/1227* (2013.01); *H01G 4/1245* (2013.01); *H05K 1/111* (2013.01); *H05K 2201/10015* (2013.01); *H05K 2201/10628* (2013.01); *H05K 2201/2018* (2013.01); *H05K 2201/2045* (2013.01)

(58) Field of Classification Search
CPC ....... H05K 2201/10015; H05K 1/0271; H05K 2201/2018; H05K 1/111; H01G 2/06; H01G 4/1245; H01G 4/1227; H01G 4/008; H01G 4/005; H01G 4/232; H01G 4/224; H01G 4/248; H01G 4/2325; H01G 4/30; H01G 4/12

See application file for complete search history.

(56) References Cited

U.S. PATENT DOCUMENTS

| | | |
|---|---|---|
| 7,331,799 B1 | 2/2008 | Lee |
| 2005/0041367 A1* | 2/2005 | Yoshii .................... H01G 2/065 |
| | | 361/303 |
| 2010/0123995 A1 | 5/2010 | Otsuka et al. |
| 2010/0188798 A1 | 7/2010 | Tagashi et al. |
| 2015/0187495 A1 | 7/2015 | Maeda et al. |
| 2016/0042869 A1 | 2/2016 | Park et al. |
| 2016/0219739 A1 | 7/2016 | Park et al. |
| 2016/0260546 A1 | 9/2016 | Mori et al. |
| 2016/0343506 A1 | 11/2016 | Lee et al. |
| 2017/0162334 A1 | 6/2017 | Ra et al. |
| 2019/0008036 A1 | 1/2019 | Park et al. |

FOREIGN PATENT DOCUMENTS

| | | |
|---|---|---|
| JP | 2004-266110 A | 9/2004 |
| JP | 3847265 B2 | 11/2006 |
| JP | 2010-123614 A | 6/2010 |
| JP | 2010-186884 A | 8/2010 |
| JP | 2011-071220 A | 4/2011 |
| JP | 2014-229869 A | 12/2014 |
| KR | 10-2016-0016492 A | 2/2016 |

* cited by examiner

MULTILAYER ELECTRONIC COMPONENT AND BOARD HAVING THE SAME

CROSS-REFERENCE TO RELATED APPLICATION

This application is a Continuation Application of U.S. application Ser. No. 15/987,360, filed May 23, 2018, now U.S. Pat. No. 10,398,030, which claims benefit of priority to Korean Patent Application No. 10-2017-0138681 filed on Oct. 24, 2017, the disclosures of which are incorporated herein by reference in their entirety.

TECHNICAL FIELD

The present disclosure relates to a multilayer electronic component and a board having the same.

BACKGROUND

A multilayer capacitor, as a multilayer electronic component, is formed of a dielectric material, and since the dielectric material may have piezoelectric properties, the dielectric material may be deformed in synchronization with a voltage applied thereto.

When a period of the applied voltage is within an audible frequency band, displacement thereof becomes vibrations which may be transmitted through solders to vibrate a board and lead to sound being emitted from the board. Such sound is known as acoustic noise.

When an operating environment of a device is quiet, the acoustic noise may be perceived by a user as an abnormal sound and the user may feel that the device has a problem. Further, in a device having an audio circuit, acoustic noise may be superimposed on an audio output to degrade device quality.

Apart from the acoustic noise perceived by the human ear, the occurrence of piezoelectric vibrations of a multilayer capacitor in a high frequency range of 20 kHz or higher causes malfunctioning of various sensors used in IT and industrial/electrical fields.

SUMMARY

An aspect of the present disclosure may provide a multilayer electronic component capable of reducing acoustic noise and high frequency vibrations of 20 kHz or higher and a board having the same.

According to an aspect of the present disclosure, a multilayer electronic component may include: a multilayer capacitor including a capacitor body in which internal electrodes are stacked to be parallel with respect to a mounting surface, and first and second external electrodes including first and second body portions disposed on third and fourth surfaces of the capacitor body and connected to the internal electrodes, first and second band portions respectively extending from the first and second body portions to portions of a second surface of the capacitor body, and third and fourth band portions respectively extending from the first and second body portions to portions of a first surface of the capacitor body, the first and second surfaces opposing each other and connected to each other by the third and fourth surfaces; and first and second metal frames having first and second solder pockets and including first and second vertical portions, first and second upper horizontal portions extending from upper ends of the vertical portions and covering the first and second band portions, respectively, and first and second lower horizontal portions extending from lower ends of the vertical portions, respectively, the upper horizontal portions connected to the first and second band portions of the first and second external electrodes, respectively. $0.1 \leq G/CT \leq 0.7$ may be satisfied, in which CT is a height of the first vertical portion or a height of the second vertical portion, and G is a distance, in a direction along which the internal electrodes are stacked, between the first band portion and the lower end of the first vertical portion or between the second band portion and the second end of the second vertical portion.

The capacitor body may include a plurality of dielectric layers and the internal electrodes including plurality of first and second internal electrodes alternately disposed with the dielectric layer interposed therebetween and including fifth and sixth surfaces connected to the first and second surfaces, connected to the third and fourth surfaces, and opposing each other, one ends of the first and second internal electrodes being exposed to the third and fourth surfaces, respectively. The first lower horizontal portion may extend from the lower end of the first vertical portion in a direction toward the fourth surface of the capacitor body, and the first upper horizontal portion may extend from the upper end of the first vertical portion toward the fourth surface of the capacitor body. The second lower horizontal portion may extend from the lower end of the second vertical portion in a direction toward the third surface of the capacitor body, and the second upper horizontal portion may extend from the upper end of the second vertical portion toward the third surface of the capacitor body.

The first and second solder pockets may include first and second cutout portions formed in the first and second metal frames, respectively. The first cutout portion may include a first stress suppressing portion formed at the lower end of the first vertical portion and a first solder receiving portion formed at one end of the first lower horizontal portion and communicating with the first stress suppressing portion. The second cutout portion may include a second stress suppressing portion formed at the lower end of the second vertical portion and a second solder receiving portion formed at one end of the second lower horizontal portion and communicating with the second stress suppressing portion.

The first and second solder pockets may include first and second cutout portions formed in the first and second metal frames, respectively. The first cutout portion may be positioned at a center of the first metal frame in a direction in which the fifth and sixth surfaces of the capacitor body are connected, and the second cutout portion may be positioned at the center of a second metal frame in a direction in which the fifth and sixth surfaces of the capacitor body are connected.

The first and second solder pockets may have first and second through-holes formed in the first and second lower horizontal portions of the first and second metal frames, respectively.

The multilayer electronic component may further include: a first conductive adhesive layer disposed between the first band portion of the first external electrode and the first upper horizontal portion; and a second conductive adhesive layer disposed between the second band portion of the second external electrode and the second upper horizontal portion.

The first body portion of the first external electrode of the multilayer capacitor and the first vertical portion of the first metal frame may be spaced apart from each other, and the second body portion of the second external electrode of the multilayer capacitor and the second vertical portion of the second metal frame may be spaced apart from each other.

The multilayer electronic component may further include an insulating portion disposed between the first and second upper horizontal portions and covering the second surface of the capacitor body.

The multilayer electronic component may further include an encapsulant covering at least portions of the capacitor body, at least portions of the first and second external electrodes, and upper portions of the first and second metal frames, with the solder pocket exposed, and formed of an insulator.

The encapsulant may cover the entirety of the capacitor body and the first and second external electrodes.

According to another aspect of the present disclosure, a board having a multilayer electronic component may include: a circuit board having electrode pads on one surface thereof; and the multilayer electronic component described above. The first and second lower horizontal portions of the first and second metal frames of the multilayer electronic component may be mounted on the electrode pads, respectively.

The board may further include first and second conducive materials disposed in the first and second solder pockets and connecting the first and second lower horizontal portions to the electrode pads, respectively.

According to another aspect of the present disclosure, a multilayer electronic component may include: a multilayer capacitor including a capacitor body including first and second internal electrodes respectively exposed to first and second end surfaces of the capacitor body, and first and second external electrodes including first and second body portions disposed on the end surfaces of the capacitor body and connected to the first and second internal electrodes, respectively, first and second band portions respectively extending from the first and second body portions to portions of an upper surface of the capacitor body, and third and fourth band portions respectively extending from the first and second body portions to portions of a lower surface of the capacitor body, the upper and lower surfaces opposing each other and connected to each other by the end surfaces; and first and second metal frames having first and second cutouts and including first and second vertical portions covering the first and second end surfaces and spaced apart from the first and second end surfaces, first and second upper horizontal portions extending from the vertical portions and covering and connected to the first and second band portions, respectively, and first and second lower horizontal portions extending from the vertical portions and being spaced apart from the third and fourth band portions, respectively.

The first cutout may be formed in the first vertical portion and the first lower horizontal portion, and the second cutout may be formed in the second vertical portion and the second lower horizontal portion.

The first cutout may be formed only in the first lower horizontal portion, and the second cutout may be formed only in the second lower horizontal portion.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

A multilayer electronic component of the present disclosure includes a multilayer capacitor including a capacitor body in which internal electrodes are stacked to be parallel with respect to a mounting surface, and first and second external electrodes including first and second body portions disposed on third and fourth surfaces of the capacitor body and connected to the internal electrodes, first and second band portions respectively extending from the first and second body portions to portions of a second surface of the capacitor body, and third and fourth band portions respectively extending from the first and second body portions to portions of a first surface of the capacitor body, the first and second surfaces opposing each other and connected to each other by the third and fourth surfaces; and first and second metal frames having first and second solder pockets and including first and second vertical portions, first and second upper horizontal portions extending from upper ends of the vertical portions and covering the first and second band portions, respectively, and first and second lower horizontal portions extending from lower ends of the vertical portions, respectively, the upper horizontal portions connected to the first and second band portions of the first and second external electrodes, respectively. $0.1 \leq G/CT \leq 0.7$ may be satisfied, in which CT is a height of the first vertical portion or a height of the second vertical portion, and G is a distance, in a direction along which the internal electrodes are stacked, between the first band portion and the lower end of the first vertical portion or between the second band portion and the second end of the second vertical portion.

Figure 1:
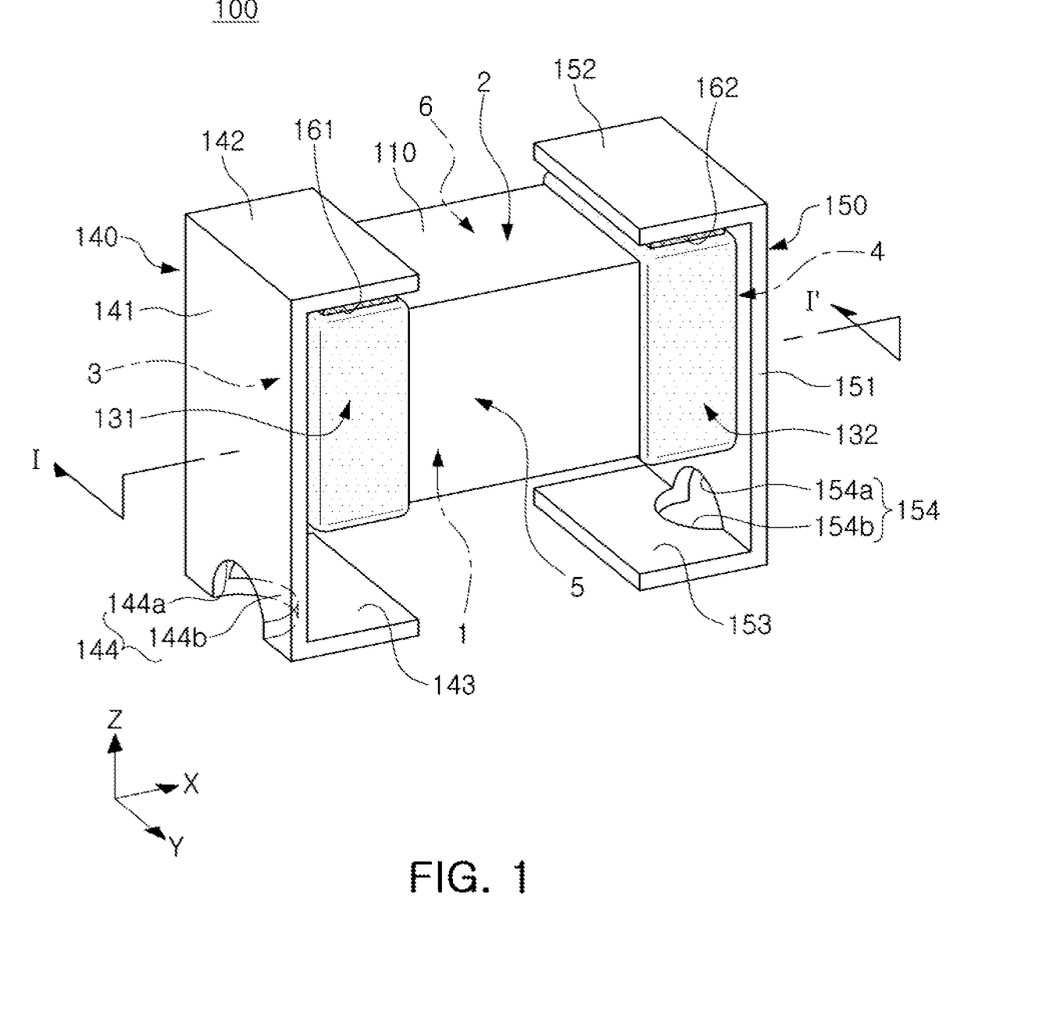
FIG. 1 is a perspective view illustrating a multilayer electronic component according to an exemplary embodiment in the present disclosure.
Figure 2:
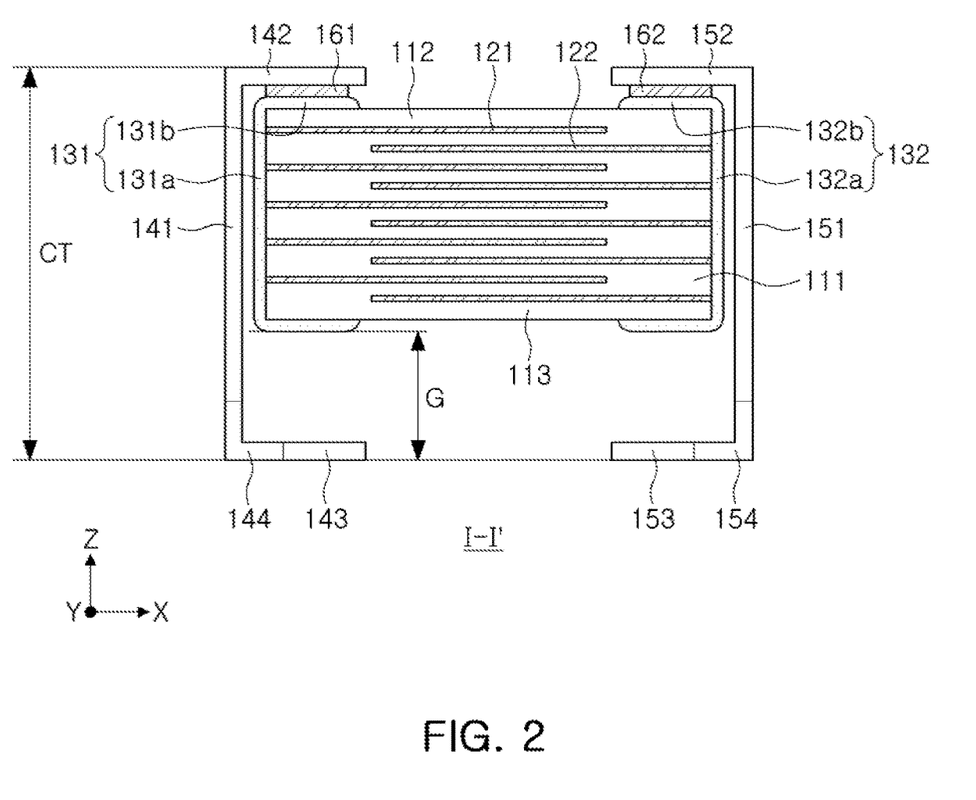
FIG. 2 is a cross-sectional view taken along line I-I' in FIG. 1.
Figure 3A:
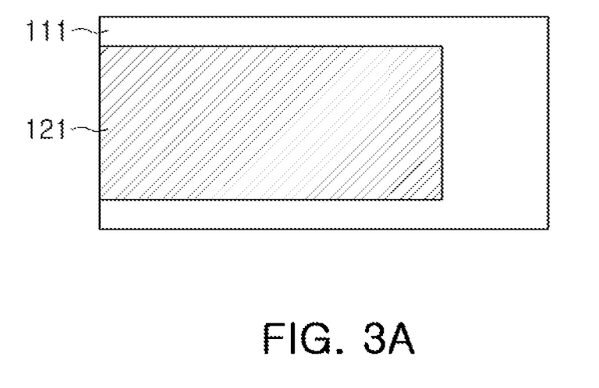
FIGS. 3A and 3B are plan views illustrating first and second internal electrodes of a multilayer electronic component according to an exemplary embodiment in the present disclosure, respectively.
Figure 3B:
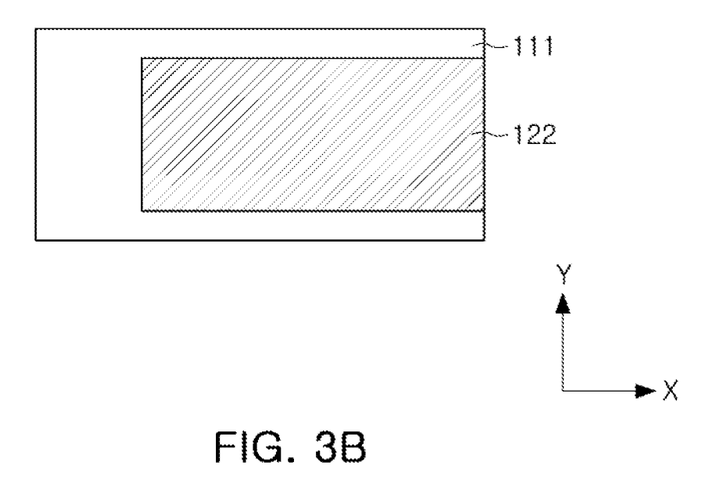

FIG. 1 is a perspective view illustrating a multilayer electronic component according to an exemplary embodiment in the present disclosure, FIG. 2 is a cross-sectional view taken along line I-I' in FIG. 1, and FIGS. 3A and 3B are plan views illustrating first and second internal electrodes of a multilayer electronic component according to an exemplary embodiment in the present disclosure, respectively.

Referring to FIGS. 1 through 3, a multilayer electronic component 100 according to an exemplary embodiment in the present disclosure includes a capacitor body 110, first and second external electrodes 131 and 132, and first and second metal frames 140 and 150 connected to the first and second external electrodes 131 and 132, respectively.

Hereinafter, in order to clarify exemplary embodiments in the present disclosure, directions of the capacitor body 110 are defined as follows. That is, X, Y, and Z illustrated in the drawings denote a length direction, a width direction, and a thickness of the capacitor body 110, respectively. Further, in the present exemplary embodiment, the thickness direction may be used as having the same concept as a lamination direction in which dielectric layers are laminated.

The capacitor body 110, formed by stacking a plurality of dielectric layers 111 in the Z direction and then sintering the plurality of dielectric layers 111, includes the plurality of dielectric layers 111 and first and second internal electrodes 121 and 122 alternately arranged in the Z direction with the dielectric layer 111 interposed therebetween.

If necessary, covers 112 and 113 having a predetermined thickness may be formed on both sides of the capacitor body 110 in the Z direction.

Here, the dielectric layers 111 adjacent to each other in the capacitor body 110 may be integrated such that the boundaries therebetween may not be readily apparent.

The capacitor body 110 may have a substantially hexahedral shape, but is not limited thereto.

In the present exemplary embodiment, for the purposes of description, both surfaces of the capacity body 110 opposing each other in the Z direction are defined as first and second surfaces 1 and 2, both surfaces connected to the first and second surfaces 1 and 2 and opposing each other in the X direction are defined are defined as third and fourth surfaces 3 and 4, and both surfaces connected to the first and second surfaces 1 and 2, connected to the third and fourth surfaces 3 and 4, and opposing each other in the Y direction are defined as fifth and sixth surfaces 5 and 6. In the present exemplary embodiment, the first surface 1 may be a surface facing a mounting direction.

The dielectric layer 111 may include a ceramic material having a high dielectric constant, for example, $BaTiO_3$-based ceramic powder, but is not limited thereto.

The $BaTiO_3$-based ceramic powder may be, for example, $(Ba_{1-x}Ca_x)TiO_3$, $Ba(Ti_{1-y}Ca_y)O_3$, $(Ba_{1-x}Ca_x)(Ti_{1-y}Zr_y)O_3$, $Ba(Ti_{1-y}Zr_y)O_3$, and the like, prepared by partially employing Ca, Zr, and the like, in $BaTiO_3$, but the present disclosure is not limited thereto.

A ceramic additive, an organic solvent, a plasticizer, a binder and a dispersant may further be added to the dielectric layer 111 together with the ceramic powder. The ceramic additive may be, for example, a transition metal oxide or a transition metal carbide, a rare earth element, magnesium (Mg), aluminum (Al), or the like.

The first and second internal electrodes 121 and 122 are electrodes having opposite polarities and are alternately arranged to face each other in the Z direction with the dielectric layer 111 interposed therebetween. One ends of the first and second internal electrodes 121 and 122 may be exposed through the third and fourth surfaces 3 and 4 of the capacitor body 110, respectively.

Here, the first and second internal electrodes 121 and 122 may be electrically insulated from each other by a dielectric layer 111 disposed in the middle.

In this manner, the ends of the first and second internal electrodes 121 and 122 alternately exposed to the third and fourth surfaces 3 and 4 of the capacitor body 110 may be electrically connected to the first and second external electrodes 131 and 132 disposed on the third and fourth surfaces 3 and 4 of the capacitor body 110 (to be described hereinafter), respectively.

The first and second internal electrodes 121 and 122 may be formed of a conductive metal such as nickel (Ni) or a Ni alloy, but the present disclosure is not limited thereto.

According to the configuration described above, when a predetermined voltage is applied to the first and second external electrodes 131 and 132, charges are accumulated between the first and second internal electrodes 121 and 122 facing each other.

Here, capacitance of the multilayer electronic component 100 is proportional to an overlap area in which the first and second internal electrodes 121 and 122 overlap each other in the Z direction.

The first and second external electrodes 131 and 132 are provided with voltages of opposite polarities and may be electrically connected to the exposed portions of the first and second internal electrodes 121 and 122, respectively.

A plating layer may be formed on the surfaces of the first and second external electrodes 131 and 132, if necessary.

For example, the first and second external electrodes 131 and 132 may include first and second conductive layers, first and second nickel (Ni) plating layers formed on the first and second conductive layers, and first and second tin (Sn) plating layers formed on the first and second plating layers, respectively.

The first external electrode 131 may include a first body portion 131a and a first band portion 131b.

The first body portion 131a is formed on the third surface 3 of the capacitor body 110 and is connected to the first internal electrodes 121. The first band portion 131b extends from the first body portion 131a to a portion of the second surface 2, a mounting surface of the capacitor body 110.

If necessary, the first band portion 131b may extend to a portion of the first surface 1 and to portions of the fifth and sixth surfaces 5 and 6 of the capacitor body 110, for the purpose of enhancing bonding strength, and the like.

The second external electrode 132 may include a second body portion 132a and a second band portion 132b.

The second body portion 132a is formed on the fourth surface 4 of the capacitor body 110 and connected to the second internal electrodes 122. The second band portion 132b extends from the second body portion 132a to a portion of the second surface 2, a mounting surface of the capacitor body 110.

Here, if necessary, the second band portion 132b may extend to a portion of the first surface 1 and to portions of the fifth and sixth surfaces 5 and 6 of the capacitor body 110, for the purpose of enhancing bonding strength, and the like.

The first metal frame 140 is formed of a conductive material and includes a first vertical portion 141, a first lower horizontal portion 143, and a first upper horizontal portion 142. If necessary, a plating layer formed of a metal which is easily soldered may be formed on a surface of the first metal frame 140.

The first vertical portion 141 is disposed to surface the first body portion 131a of the first external electrode 131.

Here, the first vertical portion 141 may be spaced apart from the first body portion 131a of the first external electrode 131.

The first vertical portion 141 may be formed to cover the entirety of the first body portion 131a of the first external electrode 131.

The first lower horizontal portion 143 is a portion extending from a lower end of the first vertical portion 141 toward the fourth surface 4 of the capacitor body 110 in the X direction. The first lower horizontal portion 143 serves as a mounting surface when mounted on the board.

A first cutout portion 144 as a solder pocket may be formed at a portion connecting the first vertical portion 141 and the first lower horizontal portion 143.

Here, the first cutout portion 144 may include a first stress suppressing portion 144a formed at the lower end of the first vertical portion 141 and a first solder receiving portion 144b formed at one end of the first lower horizontal portion 143 and communicating with the first stress suppressing portion 144a.

The first upper horizontal portion 142 is a portion extending from an upper end of the first vertical portion 141 toward the fourth surface 4 of the capacitor body 110 in the X direction and connected to the first band portion 131b formed on the second surface 2 of the capacitor body 110.

A conductive adhesive layer 161 may be disposed between a lower surface of the first upper horizontal portion 142 and the first band portion 131b.

Here, the conductive adhesive layer 161 may be a high temperature solder or a conductive resin paste but is not limited thereto.

The second metal frame 150 is formed of a conductive material and includes a second vertical portion 151, a second lower horizontal portion 153, and a second upper horizontal portion 152. If necessary, a plating layer formed of a metal which is easily soldered may be formed on a surface of the second metal frame 150.

The second vertical portion 151 is disposed to surface the second body portion 132a of the second external electrode 132.

Here, the second vertical portion 151 may be spaced apart from the second body portion 132a of the second external electrode 132.

The second vertical portion 151 may be formed to cover the entirety of the second body portion 132a of the second external electrode 132.

The second lower horizontal portion 153 is a portion extending from the lower end of the second vertical portion 151 toward the third surface 3 of the capacitor body 110 in the X direction. The second lower horizontal portion 153 serves as a mounting surface when mounted on the board.

A second cutout portion 154 as a solder pocket may be formed at a portion connecting the second vertical portion 151 and the second lower horizontal portion 153.

Here, the second cutout portion 154 may include a second stress suppressing portion 154a formed at a lower end of the second vertical portion 151 and a second solder receiving portion 154b formed at one end of the second lower horizontal portion 153 and communicating with the second stress suppressing portion 154a.

The second upper horizontal portion 152 is a portion extending from the upper end of the second vertical portion 151 toward the third surface 3 of the capacitor body 110 in the X direction and connected to the second band portion 132b formed on the second surface 2 of the capacitor body 110.

A conductive adhesive layer 162 may be disposed between a lower surface of the second upper horizontal portion 152 and the second band portion 132b.

Here, the conductive adhesive layer 162 may be a high temperature solder or a conductive resin paste but is not limited thereto.

The first and second stress suppressing portions 144a and 154a disperse stress due to piezoelectric vibrations transmitted from the capacitor body 110 to suppress the stress and reduce vibration transmission to reduce acoustic noise.

When the multilayer electronic component 100 is mounted on a board, the first and second stress suppressing portions 144a and 154a may distribute external shock or stress transmitted from the set board to the capacitor body 110 to reduce impact received by the multilayer electronic component 100, thus improving reliability of a product.

When the multilayer electronic component 100 is mounted on the board and solder is formed, the first and second solder receiving portions 144b and 154b may limit a height of formation of a solder fillet to effectively block a path through which piezoelectric vibrations of the capacitor body 110 is transmitted, reducing acoustic noise.

Here, the first cutout portion 144 may be located at the center of the first metal frame 140 in the Y direction in which the fifth and sixth surfaces 5 and 6 of the capacitor body 110 are connected, and the second cutout portion 154 may be located at the center of the second metal frame 150 in the Y direction in which the fifth and sixth surfaces 5 and 6 of the capacitor body 110 are connected.

In the present exemplary embodiment, when a height of the first or second vertical portion 141 or 151 is denoted as CT and a distance between the lower band portion of the first or second external electrode 131 or 132 and the lower end of the first or second metal frames 140 and 150, i.e., a distance from the lower band portion to the lower end of the first and second lower horizontal portions 143 and 153, is defined as G, $0.1 \leq G/CT \leq 0.7$ may be satisfied.

When the above-mentioned range is satisfied, contact between the multilayer electronic component and the board as described hereinafter may be avoided, minimizing transmission of piezoelectric vibrations of the capacitor body.

TABLE 1

| # | G/CT | Acoustic noise (dBA) | Collapse occurrence |
|---|------|----------------------|---------------------|
| 1 | 0.05 | 32 | x |
| 2 | 0.1  | 26 | x |
| 3 | 0.3  | 22 | x |
| 4 | 0.5  | 20 | x |
| 5 | 0.7  | 27 | x |
| 6 | 1.0  | 34 | o |

Table 1 shows acoustic noise according to a change in G/CT in a 2012 size multilayer capacitor.

Referring to Table 1, it can be seen that, when the G/CT is less than 0.1, elastic force of the metal frame is lowered to cause acoustic noise to exceed 30 dBA, resulting in a reduction in the effect of reducing acoustic noise.

Also, it can be seen that, when the G/CT exceeds 0.7, the height of the multilayer electronic component is so high that the multilayer electronic component is collapsed after being mounted on the board, or the metal frame itself shakes to cause the acoustic noise to exceed 30 dBA, resulting in a reduction in the effect of reducing acoustic noise.

Figure 4:
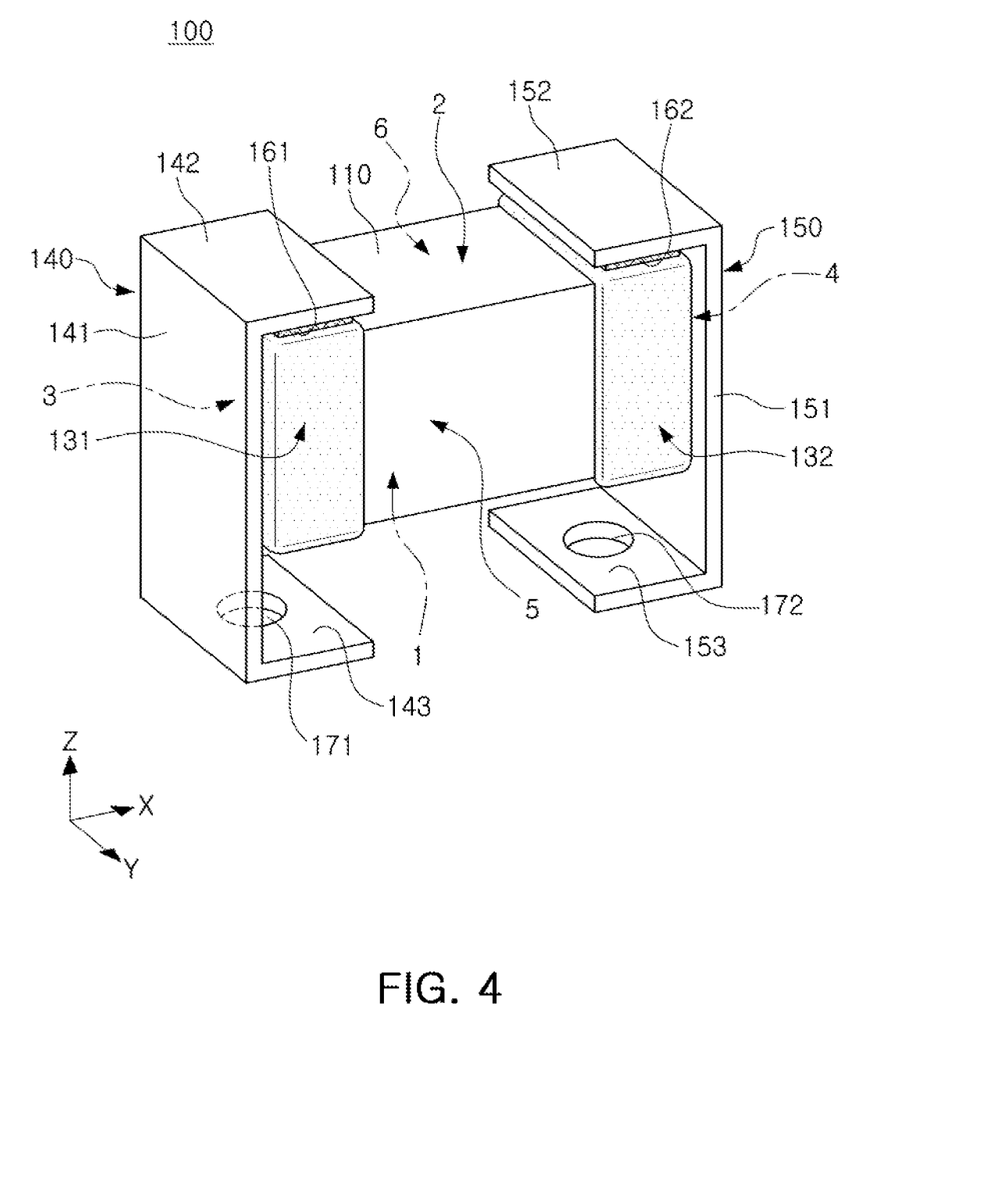
FIG. 4 is a perspective view illustrating a modification of a solder pocket.

FIG. 4 is a perspective view illustrating a modification of a solder pocket.

Referring to FIG. 4, the solder pockets may be formed as through-holes 171 and 172 in the first and second lower horizontal portions 143 and 153 as mounting surfaces, respectively, when mounted, in the first and second metal frames 140 and 150.

In other words, the solder pockets are not formed in the first and second vertical portions 141 and 151. In this case, maximized rigidity of the first and second metal frames 140 and 150 may be ensured, improving reliability of the multilayer electronic component.

Figure 5:
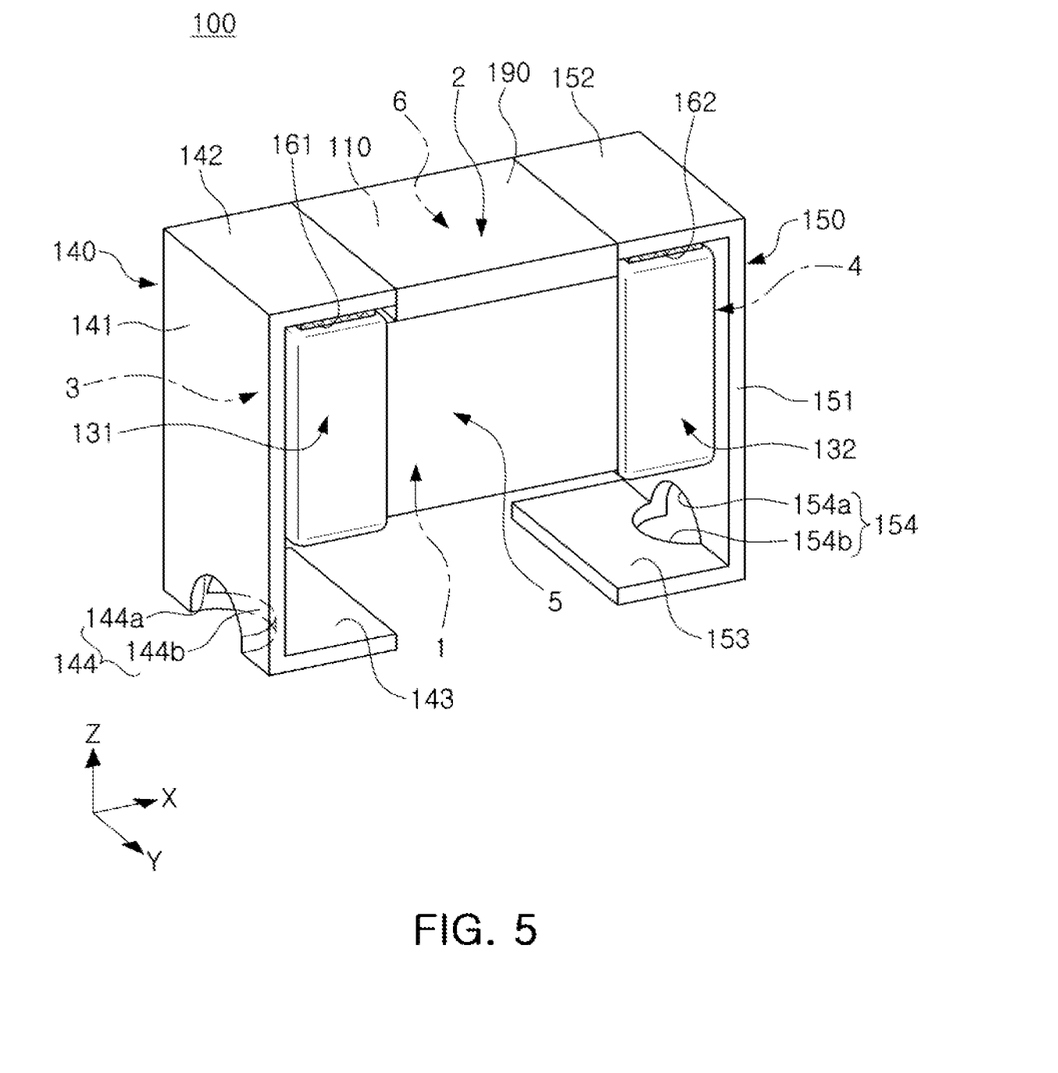
FIG. 5 is a perspective view illustrating an insulating portion additionally formed in a multilayer electronic component according to an exemplary embodiment in the present disclosure.

FIG. 5 is a perspective view illustrating a multilayer electronic component further including an insulating portion according to an exemplary embodiment in the present disclosure.

Referring to FIG. 5, an insulating portion 190 may be formed between the first and second upper horizontal portions 142 and 152. Here, the insulating portion 190 may be formed to cover the second surface 2 of the capacitor body 110.

The insulating portion 190 serves to allow the upper surface of the multilayer electronic component to be a flat surface without a step, preventing an adhesion failure due to a step at the time of contacting an SMD nozzle.

The insulating portion 190 may be formed of a material such as a heat dissipation paste or an epoxy, but is not limited thereto.

When the insulating portion 190 is formed of a heat dissipation paste, heat of the capacitor body may be outwardly dissipated to improve reliability of the product. When the insulating portion 190 is formed of epoxy, the insulating portion 190 may be in contact with the first and second upper horizontal portions 142 and 152 of the first and second metal frames 140 and 150, further improving bonding strength of the metal frame.

Figure 6:
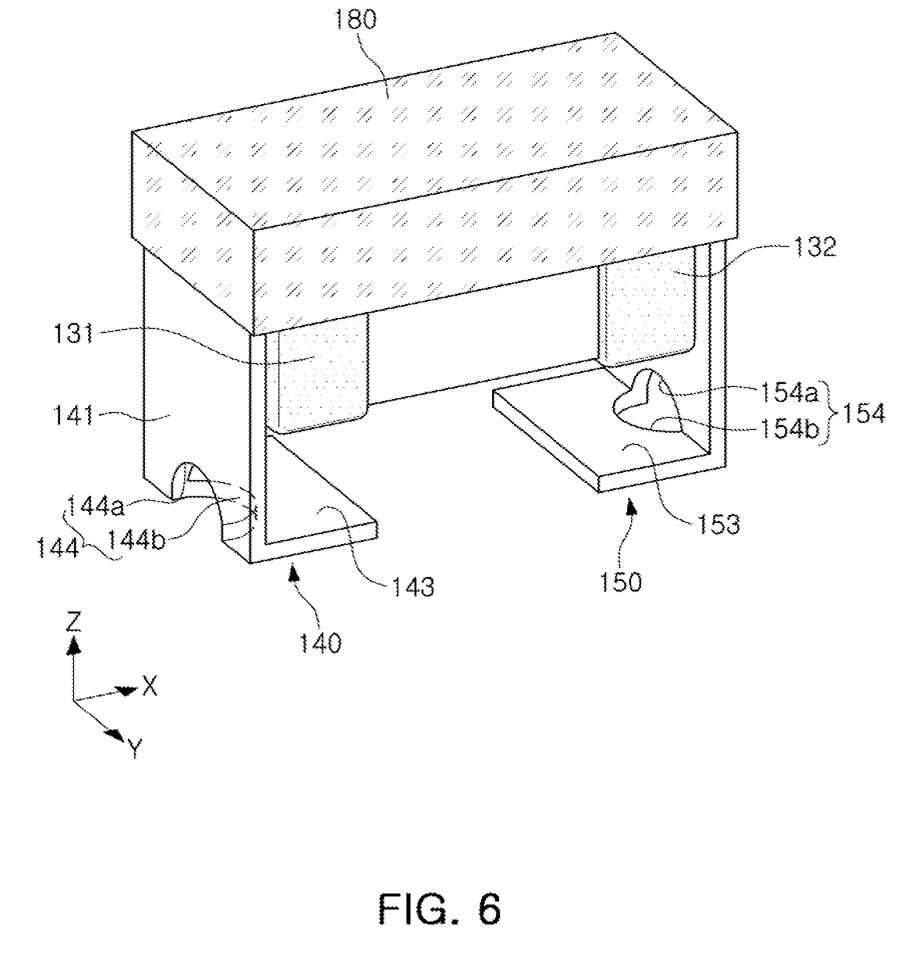
FIG. 6 is a perspective view illustrating an example of a encapsulant formed in the multilayer electronic component shown in FIG. 1.
Figure 7:
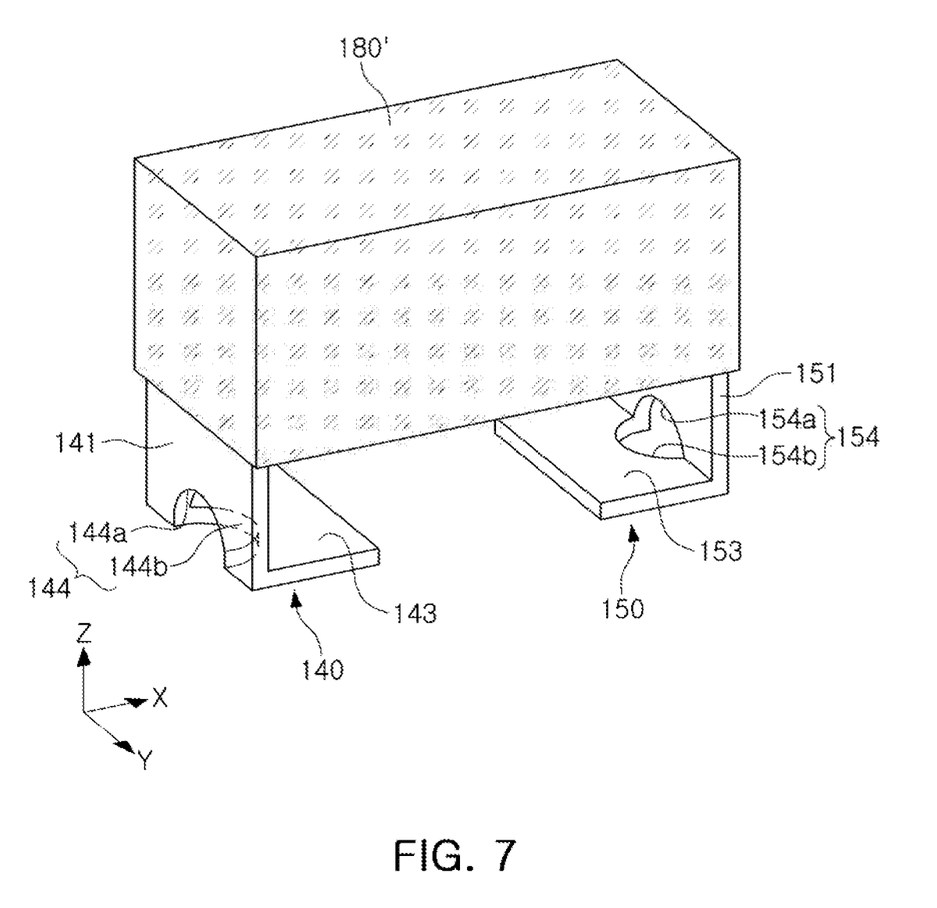
FIG. 7 is a perspective view illustrating another example of the encapsulant in FIG. 6.

FIG. 6 is a perspective view illustrating an encapsulant provided in the configuration of FIG. 1, and FIG. 7 is a perspective view illustrating another example of the encapsulant in FIG. 6.

Referring to FIG. 6, a multilayer electronic component of the present exemplary embodiment may further include an encapsulant 180.

The encapsulant 180 may be formed of an insulator and cover at least portions of the capacitor body 110, the first and second external electrodes 131 and 132, the first and second upper horizontal portions 142 and 152 and the first and second vertical portions 141 and 151 of the first and second metal frames 140 and 150, with the first and second cutout portions 144 and 154 as solder pockets exposed.

The encapsulant 180 may make an upper surface of the multilayer electronic component a flat surface without a step, preventing defective bonding due to a step at the time of contacting an SMD nozzle. In addition, the encapsulant 180 may protect the product from an external impact, improving reliability of the multilayer electronic component.

As illustrated in FIG. 7, the encapsulant 180' may be formed to cover the entirety of the capacitor body 110 and the first and second external electrodes 131 and 132, if necessary.

When voltages having opposite polarities are applied to first and second external electrodes and formed in a multilayer electronic component in a state in which the multilayer electronic component is mounted on a circuit board, a capacitor body expands and contracts in a thickness direction due to an inverse piezoelectric effect of dielectric layers while the opposing ends of the first and second external electrodes contract and expand, opposite to the expansion and contraction of the capacitor body in the thickness direction due to the Poisson effect.

Such contraction and expansion generate vibrations. In addition, the vibrations are transmitted from the first and second external electrodes to the circuit board and a sound is radiated from the circuit board to be acoustic noise.

Figure 8:
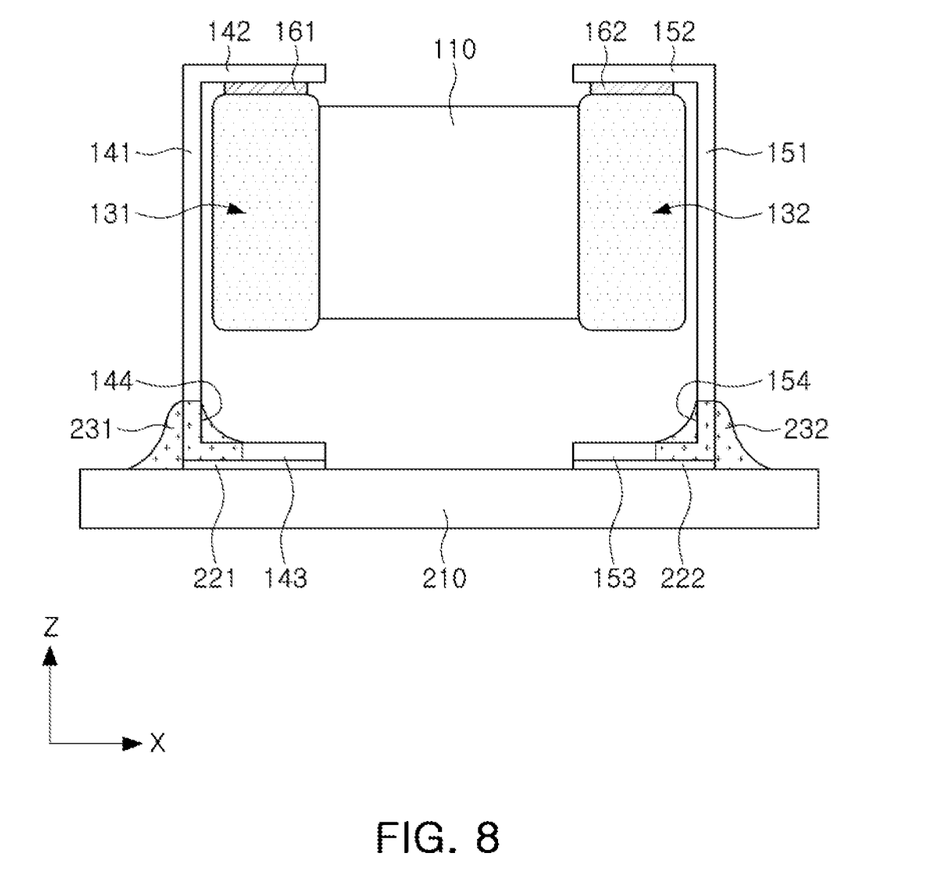
FIG. 8 is a front view schematically illustrating a state in which a multilayer electronic component according to an exemplary embodiment in the present disclosure is mounted on a board.

FIG. 8 is a front view schematically illustrating a state in which a multilayer electronic component according to an exemplary embodiment in the present disclosure is mounted on a board.

Referring to FIG. 8, a board having a multilayer electronic component according to the present exemplary embodiment includes the circuit board 210 having first and second electrode pads 221 and 222 on one surface thereof and a multilayer electronic component mounted on an upper surface of the circuit board 210 such that the first and second metal frames 140 and 150 are connected to the first and second electrode pads 221 and 222, respectively.

Here, the first and second lower horizontal portions 143 and 153 of the first and second metal frames 140 and 150 may be connected to the first and second electrode pads 221 and 222, respectively.

In the present exemplary embodiment, the first and second upper horizontal portions of the first and second metal frames are bonded to the upper portions of the first and second band portions of the first and second external electrodes, opposing the mounting surface. In the present exemplary embodiment, the capacitor body includes the internal electrodes stacked horizontally with respect to the mounting surface so that a vibration displacement is reduced toward the third and fourth surfaces of the capacitor body, whereby the amount of the vibration displacement transmitted from the capacitor body to the board may be reduced, further reducing acoustic noise.

Also, in the present exemplary embodiment, the multilayer electronic component is illustrated as being mounted on the circuit board 210 by solders 231 and 232, but a conductive paste, or the like, may be used instead of solder, if necessary.

According to the present exemplary embodiment, the first and second cutout portions 144 and 154 of the first and second metal frames 140 and 150 serve to solder pockets confining the solders 231 and 232 on the first surface side of the capacitor body 110.

Accordingly, when the multilayer electronic component 100 is mounted on the circuit board 210, the solder 231 and 232 may be effectively confined in the first and second cutout portions 144 and 154, whereby formation of a solder fillet in the capacitor body 110 and the first and second external electrodes 131 and 132 may be restrained or minimized in height.

Therefore, a path through which piezoelectric vibrations of the multilayer electronic component are transmitted is blocked, maximum displacement points in the solder fillet and the capacitor body 110 are separated from each other, and an external impact or stress transmitted from the capacitor body 110 to the circuit board 210 is reduced by elasticity of the metal frame, enhancing the acoustic noise reduction effect of the multilayer electronic component.

According to the present exemplary embodiment, the acoustic noise reduction structure may effectively suppress the amount of piezoelectric vibrations transmitted from the multilayer electronic component to the board at the audible frequency within 20 kHz.

Therefore, since high frequency vibrations of the multilayer electronic component are reduced, malfunction of sensors, which may be a problem due to high frequency vibrations of 20 kHz or higher of the electronic component in the IT or industrial/electric fields may be prevented and accumulation of internal fatigue due to long-term vibrations of the sensors may be suppressed.

As set forth above, according to exemplary embodiments of the present disclosure, acoustic noise in the audible frequency region of 20 kHz or lower and high frequency vibrations of 20 kHz or higher of the multilayer electronic component may be reduced.

While exemplary embodiments have been shown and described above, it will be apparent to those skilled in the art that modifications and variations could be made without departing from the scope of the present disclosure as defined by the appended claims.

What is claimed is:

1. A multilayer electronic component comprising:
a multilayer capacitor including:
a capacitor body in which first and second internal electrodes are stacked to be parallel with respect to a mounting surface, the first internal electrodes exposed from a third surface of the capacitor body and the second internal electrodes exposed from a fourth surface of the capacitor body,
a first external electrode including a first body portion disposed on the third surface of the capacitor body and connected to the first internal electrodes, a second band portion extending from the first body portion to a portion of a second surface of the capacitor body, and a third band portion extending from the first body portion to a portion of a first surface of the capacitor body,
a second external electrode including a second body portion disposed on the fourth surface of the capacitor body and connected to the second internal electrodes, a second band portion extending from the second body portion to another portion of the second surface of the capacitor body, and a fourth band portion extending from the second body portion to another portion of the first surface of the capacitor body, the first and second surfaces opposing each other and connected to each other by the third and fourth surfaces;
a first metal frame having a first solder pocket and including a first vertical portion, a first upper horizontal portion extending from an upper end of the first vertical portion and covering the first band portion, and a first lower horizontal portion extending from a lower end of the first vertical portion; and
a second metal frame having a second solder pocket and including a second vertical portion, a second upper horizontal portion extending from an upper end of the second vertical portion and covering the second band portion, and a second lower horizontal portion extending from a lower end of the second vertical portion;
a first conductive adhesive layer disposed between the first band portion of the first external electrode and the first upper horizontal portion to connect the first upper horizontal portion and the first band portion to each other, the first conductive adhesive layer spaced apart from the first body portion; and
a second conductive adhesive layer disposed between the second band portion of the second external electrode and the second upper horizontal portion to connect the second upper horizontal portion and the second band portion to each other, the second conductive adhesive layer spaced apart from the second body portion,
wherein $0.1 \leq G/CT \leq 0.7$ is satisfied, in which CT is a height of the first vertical portion or a height of the second vertical portion, and G is a distance, in a direction along which the internal electrodes are stacked, between the first band portion and the lower end of the first vertical portion or between the second band portion and the lower end of the second vertical portion.

2. The multilayer electronic component of claim 1, wherein
the capacitor body further includes fifth and sixth surfaces connected to the first and second surfaces, connected to the third and fourth surfaces, and opposing each other,
the first lower horizontal portion extends from the lower end of the first vertical portion in a direction toward the fourth surface of the capacitor body, and
the second lower horizontal portion extends from the lower end of the second vertical portion in a direction toward the third surface of the capacitor body.

3. The multilayer electronic component of claim 1, wherein
the first body portion of the first external electrode of the multilayer capacitor and the first vertical portion of the first metal frame are spaced apart from each other, and
the second body portion of the second external electrode of the multilayer capacitor and the second vertical portion of the second metal frame are spaced apart from each other.

4. The multilayer electronic component of claim 1, further comprising:
an insulating portion disposed between the first and second upper horizontal portions and covering the second surface of the capacitor body.

5. The multilayer electronic component of claim 1, further comprising:
an encapsulant covering at least portions of the capacitor body, at least portions of the first and second external electrodes, and the first and second upper horizontal portions of the first and second metal frames, with the solder pocket exposed, and including an insulator.

6. The multilayer electronic component of claim 5, wherein
the encapsulant covers the entirety of the capacitor body and the first and second external electrodes.

7. The multilayer electronic component of claim 1, wherein the first and second solder pockets have first and second through-holes disposed in the first and second lower horizontal portions of the first and second metal frames, respectively.

8. The multilayer electronic component of claim 1, wherein
the first solder pocket includes a first cutout portion, the first cutout portion including a first portion extending through the lower end of the first vertical portion and a second portion extending through one end of the first lower horizontal portion and communicating with the first portion, and
the second solder pocket includes a second cutout portion, the second cutout portion including a third portion extending through the lower end of the second vertical portion and a fourth portion extending through one end of the second lower horizontal portion and communicating with the third portion.

9. The multilayer electronic component of claim 8, wherein
the first cutout portion is disposed only in the first lower horizontal portion, and the second cutout portion is disposed only in the second lower horizontal portion.

10. The multilayer electronic component of claim 8, wherein
the first and second solder pockets include first and second cutout portions disposed in the first and second metal frames, respectively,
the first cutout portion is positioned at a center of the first metal frame in a direction in which fifth and sixth surfaces of the capacitor body are connected, and the second cutout portion is positioned at a center of the second metal frame in a direction in which the fifth and sixth surfaces of the capacitor body are connected.

11. The multilayer electronic component of claim 1, wherein
   the first and second upper horizontal portions extend directly from upper ends of the vertical portions and covering the first and second band portions, respectively, and
   the first and second lower horizontal portions extend directly from lower ends of the vertical portions, respectively.

12. A board having a multilayer electronic component, the board comprising:
   a circuit board having electrode pads on one surface thereof; and
   the multilayer electronic component of claim 1,
   wherein the first and second lower horizontal portions of the first and second metal frames of the multilayer electronic component are mounted on the electrode pads, respectively.

13. The board of claim 12, further comprising first and second conducive materials disposed in the first and second solder pockets and connecting the first and second lower horizontal portions to the electrode pads, respectively.

* * * * *